(12) United States Patent
Sun et al.

(10) Patent No.: US 11,152,054 B2
(45) Date of Patent: Oct. 19, 2021

(54) APPARATUSES AND METHODS FOR PERFORMING BACKGROUND OPERATIONS IN MEMORY USING SENSING CIRCUITRY

(71) Applicant: Micron Technology, Inc., Boise, ID (US)

(72) Inventors: Honglin Sun, Boise, ID (US); Richard C. Murphy, Boise, ID (US); Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/553,313

(22) Filed: Aug. 28, 2019

(65) Prior Publication Data

US 2021/0065765 A1 Mar. 4, 2021

(51) Int. Cl.
*G11C 7/22* (2006.01)
*G11C 11/409* (2006.01)
*G11C 11/4074* (2006.01)
*G11C 16/26* (2006.01)
*G11C 11/406* (2006.01)

(52) U.S. Cl.
CPC .......... *G11C 11/409* (2013.01); *G11C 7/222* (2013.01); *G11C 11/406* (2013.01); *G11C 11/4074* (2013.01); *G11C 16/26* (2013.01)

(58) Field of Classification Search
CPC ....... G11C 11/409; G11C 16/26; G11C 7/222; G11C 11/406; G11C 11/4074
See application file for complete search history.

(56) References Cited

U.S. PATENT DOCUMENTS

| 5,050,095 | A | 9/1991 | Samad | |
|---|---|---|---|---|
| 6,421,265 | B1* | 7/2002 | Lien | G11C 15/04 365/189.05 |
| 7,043,466 | B2 | 5/2006 | Watanabe et al. | |
| 7,564,721 | B2* | 7/2009 | Roohparvar | G11C 16/102 365/185.29 |
| 7,609,552 | B2 | 10/2009 | Li et al. | |
| 8,429,352 | B2 | 4/2013 | Sinclair | |
| 8,638,602 | B1 | 1/2014 | Horn | |
| 10,074,416 | B2* | 9/2018 | Hush | G11C 7/065 |
| 2004/0073764 | A1 | 4/2004 | Andreasson | |
| 2014/0201473 | A1* | 7/2014 | Falanga | G06F 3/0665 711/154 |
| 2015/0029798 | A1* | 1/2015 | Manning | G11C 7/1048 365/189.07 |
| 2015/0357019 | A1* | 12/2015 | Wheeler | G11C 11/4093 365/189.05 |
| 2015/0357047 | A1* | 12/2015 | Tiwari | G06F 9/30032 714/719 |
| 2018/0033479 | A1* | 2/2018 | Lea | G11C 8/12 |

* cited by examiner

*Primary Examiner* — Mushfique Siddique
(74) *Attorney, Agent, or Firm* — Brooks, Cameron & Huebsch, PLLC

(57) ABSTRACT

Apparatuses and methods can be related to performing operations in memory. Operations can be performed in the background while the memory is performing different operations. For example, comparison operations can be performed by the memory device while the memory device is reading data. The results of the comparison operations can be stored in registers of the memory device. The registers can be made accessible externally to the memory device.

19 Claims, 5 Drawing Sheets

US 11,152,054 B2

APPARATUSES AND METHODS FOR PERFORMING BACKGROUND OPERATIONS IN MEMORY USING SENSING CIRCUITRY

TECHNICAL FIELD

The present disclosure relates generally to memory, and more particularly to apparatuses and methods associated with implementing operations in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. including, but not limited to personal computers, portable memory sticks, digital cameras, cellular telephones, portable music players such as MP3 players, movie players, and other electronic devices. Memory cells can be arranged into arrays, with the arrays being used in memory devices.

Various computing systems include a number of processing resources that are coupled to memory (e.g., a memory system), which is accessed in association with executing a set of instructions (e.g., a program, applications, etc.). The processing resources can execute instructions to perform a number of operations. For example, the processing resource can execute a database to store data and search for the data.

DETAILED DESCRIPTION

The present disclosure includes apparatuses and methods related to performing operations in memory. In some examples, the operations can be performed in memory while the memory is performing different operations such as a refresh operation, a read operation, and/or a write operation, among other operations. Performing operations while the memory is performing other operations can be referred to as performing background operations in memory.

Performing background operations in memory can be more efficient than performing the same operations (e.g., not in the background) in memory because performing background operations utilizes data that is latched in the sensing circuitry to perform the operations. For example, data that is read from the memory array can be latched in the sensing circuitry prior to providing the data through data lines (e.g., DQs). While the data is latched in the sensing circuitry, the data can also be used to perform operations. As such, data stored in the sensing circuitry can be used for multiple purposes, which can include performing background operations in memory. The term "background operations" is not intended to limit the type of operations that can be performed, but describes the performance of any type of operations in tandem with any other type of operation.

The results of performing the background operations can be stored in registers of a memory device. The registers can be made available to report the results of the background operations. Making the results available can be different than responding to a command to perform an operation by providing the results through the DQs given that the results to the background operations are stored and made accessible at a different time. For example, a read operation can provide the accessed data responsive to concluding the read operation while a background operation can provide results independent of the conclusion of the background operation given that the results are stored in the memory device and that the results can be retrieved at any time from the memory device.

Figure 1:
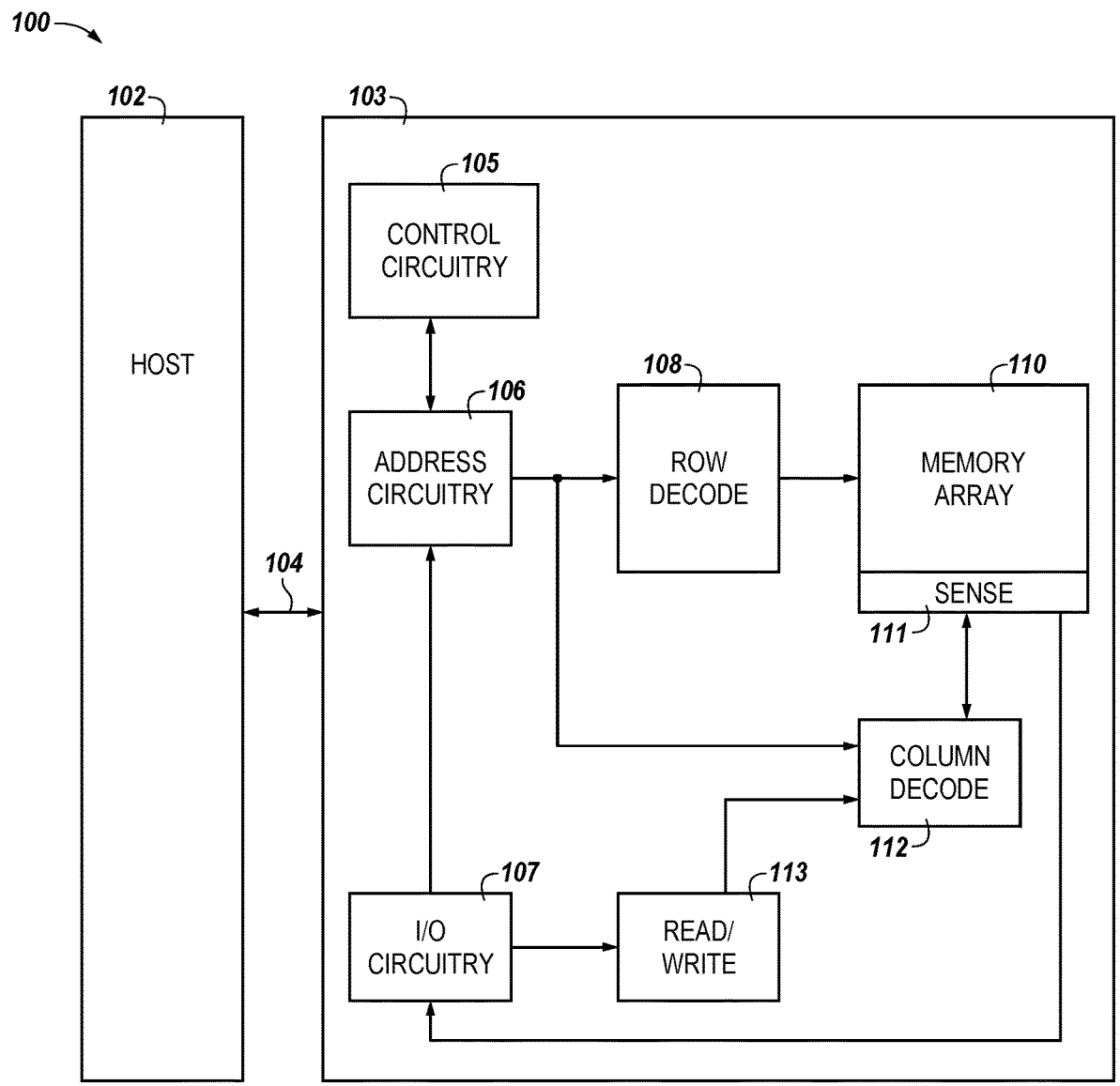
FIG. 1 is a block diagram of an apparatus in the form of a computing system including a memory device in accordance with a number of embodiments of the present disclosure.

FIG. 1 is a block diagram of an apparatus in the form of a computing system 100 including a memory device 103 in accordance with a number of embodiments of the present disclosure. As used herein, a memory device 103, a memory array 110, and/or a host 102, for example, might also be separately considered an "apparatus."

In this example, system 100 includes a host 102 coupled to memory device 103 via an interface 104. The computing system 100 can be a personal laptop computer, a desktop computer, a digital camera, a mobile telephone, a memory card reader, or an Internet-of-Things (IoT) enabled device, among various other types of systems. Host 102 can include a number of processing resources (e.g., one or more processors, microprocessors, or some other type of controlling circuitry) capable of accessing memory 103. The system 100 can include separate integrated circuits, or both the host 102 and the memory device 103 can be on the same integrated circuit. For example, the host 102 may be a system controller of a memory system comprising multiple memory devices 103, with the system controller 102 providing access to the respective memory devices 103 by another processing resource such as a central processing unit (CPU). The host 102 can also be an AI chip configured for AI processing.

In the example shown in FIG. 1, the host 102 is responsible for executing an operating system (OS) and/or various applications that can be loaded thereto (e.g., from memory device 103 via control circuitry 105). The OS and/or various applications can be loaded from the memory device 103 by providing access commands from the host 102 to the memory device 103 to access the data comprising the OS and/or the various applications. The host 102 can also access data utilized by the OS and/or various applications by providing access commands to the memory device 103 to retrieve said data utilized in the execution of the OS and/or the various applications.

For clarity, the system 100 has been simplified to focus on features with particular relevance to the present disclosure. The memory array 110 can be a DRAM array, SRAM array, STT RAM array, PCRAM array, TRAM array, RRAM array, NAND flash array, and/or NOR flash array, for instance. The array 110 can comprise memory cells arranged in rows coupled by access lines (which may be referred to herein as word lines or select lines) and columns coupled by sense lines (which may be referred to herein as digit lines or data lines). Although a single array 110 is shown in FIG. 1, embodiments are not so limited. For instance, memory device 103 may include a number of arrays 110 (e.g., a number of banks of DRAM cells).

The memory device 103 includes address circuitry 106 to latch address signals provided over an interface 104. The interface can include, for example, a physical interface employing a suitable protocol (e.g., a data bus, an address bus, and a command bus, or a combined data/address/command bus). Such protocol may be custom or proprietary, or the interface 104 may employ a standardized protocol, such as Peripheral Component Interconnect Express (PCIe), Gen-Z, CCIX, or the like. Address signals are received and decoded by a row decoder 108 and a column decoder 112 to access the memory array 110. Data can be read from memory array 110 by sensing voltage and/or current changes on the sense lines using sensing circuitry 111. The sensing circuitry 111 can comprise, for example, sense amplifiers that can read and latch a page (e.g., row) of data from the memory array 110. The I/O circuitry 107 can be used for bi-directional data communication with the host 102 over the interface 104. The read/write circuitry 113 is used to write data to the memory array 110 or read data from the memory array 110. As an example, the circuitry 113 can comprise various drivers, latch circuitry, etc.

Control circuitry 105 decodes signals provided by the host 102. The signals can be commands provided by the host 102. These signals can include chip enable signals, write enable signals, and address latch signals that are used to control operations performed on the memory array 110, including data read operations, data write operations, and data erase operations. In various embodiments, the control circuitry 105 is responsible for executing instructions from the host 102. The control circuitry 105 can comprise a state machine, a sequencer, and/or some other type of control circuitry, which may be implemented in the form of hardware, firmware, or software, or any combination of the three. In some examples, the host 102 can be a controller external to the memory device 103. For example, the host 102 can be a memory controller which is coupled to a processing resource of a computing device. Data can be provided to the memory array 110 and/or from the memory array via the data lines 116.

The sensing circuitry 111 can be configured to perform operations. For example, the sensing circuitry 111 can be configured to compare bits from a first data value to bits from a second data value. Memory cells coupled to a plurality of sense lines and a select line can store bits which may be referred to as a row of the memory array. The bits comprising the row of the memory array may be subdivided such that a row of the memory array can be comprised of a plurality of data values. For example, a row of the memory array can be comprised of a plurality of data values, where each of the data values comprises eight bits. Each of the data value can also be referred to as a bit-vector. Although the data values are described as a bit-vector comprising eight bits, the data values can be comprised of more or less bits than those described herein.

The sensing circuitry 111 can be configured to perform background operations. For example, the sensing circuitry 111 can compare data values while refreshing the data values stored in corresponding memory cells.

The sensing circuitry 111 can store the results of the operations performed by the sensing circuitry in registers. The registers can comprise, for example, multipurpose registers (MPRs) and/or static RAM (SRAM). The registers can be accessed by the host 102 via a DDR interface such as interface 104. Although the examples described herein provide the registers as MPRs and/or SRAM, the registers can comprise other types of memory including volatile and non-volatile memory.

Although the operations are shown as being performed by the sensing circuitry 111, the operations can also be performed in an analog fashion or digitally in a processing resource implemented "under" the array. Performing operations in an analog fashion can include activating multiple rows of the memory array 210 and determining whether the sensed voltages are substantially equal to a threshold (e.g., Vdd/2) or 0. If the sensed voltages deviate from an expected voltage, then the values stored by memory cells coupled to the rows are not substantially equal. If the sensed voltages do not deviate from the expected voltages, then the values stored by the memory cells are substantially equal.

A processing resources can be configured as complementary metal-oxide-semiconductor (CMOS) under the memory array 110. The processing resource (e.g., CMOS under array) can include a number of logic blocks that are configured to perform various functions, for example, using data values stored in the memory array 110. The processing resource can further be coupled to the sense amplifiers 111 and/or the data lines such that the processing resource can provide data to the sense amplifiers 111 and/or the data lines coupling the memory array 110 to the I/O circuitry 107. The processing resource (e.g., CMOS under array) can be described as existing in lay of the memory array 110 that is different than the layer comprising the sensing circuitry and/or an array or memory cells. The processing resource can be configured to perform background operations to compare data values while refreshing the data values stored in the corresponding memory cells.

Figure 2:
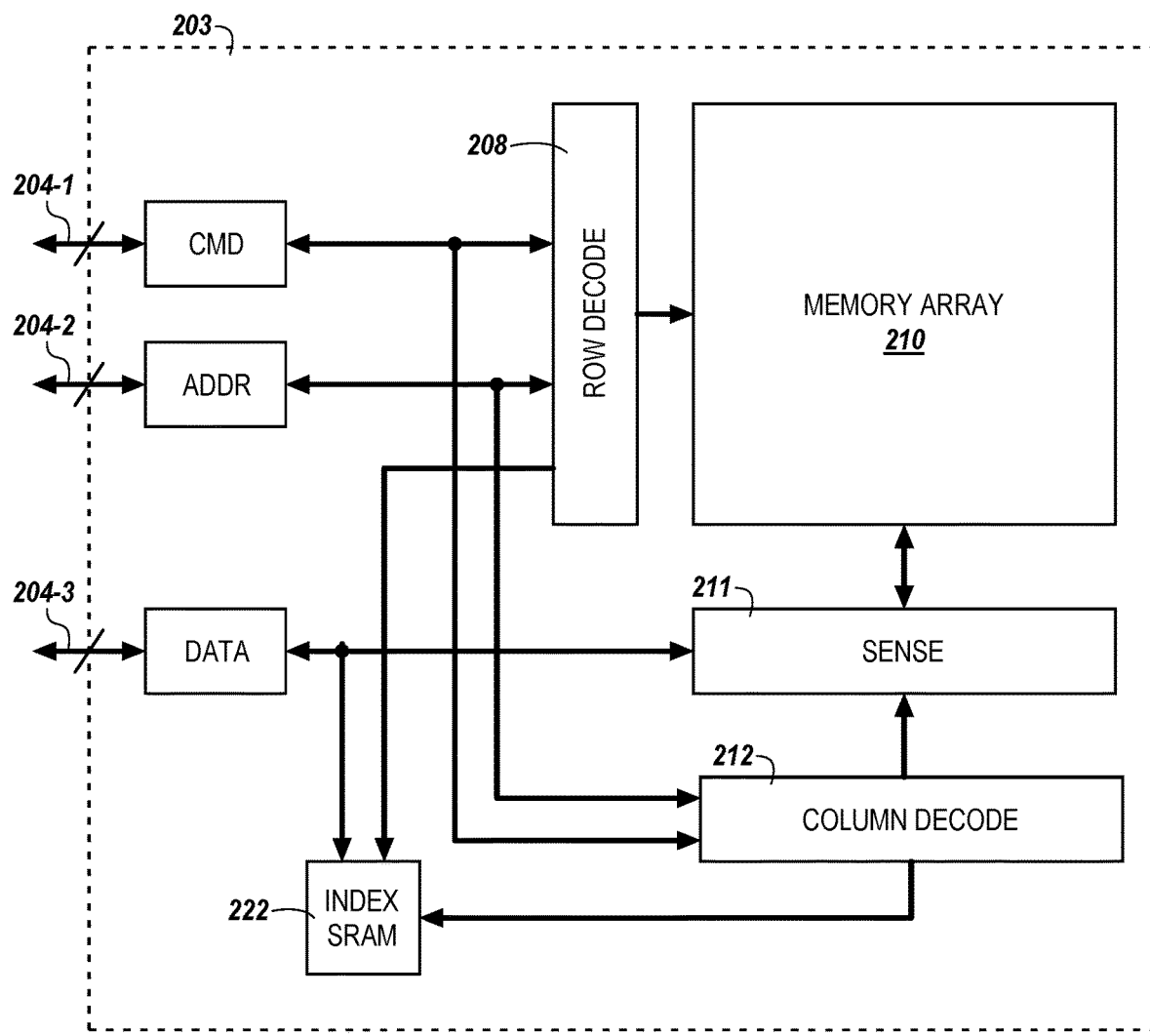
FIG. 2 is a block diagram an apparatus in the form of a memory device including registers in accordance with a number of embodiments of the present disclosure.

FIG. 2 is a block diagram of an apparatus in the form of a memory device 203 including registers 222 in accordance with a number of embodiments of the present disclosure. The memory device 203 includes a memory array 210, a row decoder 208 coupled to the memory array 210, and a column decoder 212 also coupled to the memory array 210. The memory device 203 also includes sensing circuitry 211 coupled to the memory array 210 and the column decoder 212. The memory device 203 further includes registers 222 which are shown as SRAM 222. The memory device 203 also includes interfaces 204-1, 204-2, and 204-3.

The interface 204-1 can be a command interface. The interface 204-2 can be an address interface. The interface 204-3 can be a data interface. The interface 204-1 can receive a background operation command. The background operation command can be received from a host, for example. The data interface 204-3 can receive data corresponding to the background operation command.

For example, if the background operation command received via the command interface 204-1 is a command requesting a search of the data stored in the memory array 210, then the data provided via the data interface 204-3 can be a data which is being searched for. The data being searched for can be provided to the SRAM 222. The data being searched for can be stored in the SRAM 222. The data can also be stored in the sensing circuitry 211.

In some examples, commands received via the command interface 204-1 can select between a number of preferences. For example, a background command can include a selection of whether the background command is to be performed during write operations, read operations, and/or refresh operations.

The example of FIG. 2 describes performing the background command concurrently with refresh operations. Performing refresh operations can include reading a row of data from memory cells of the memory array 210 and storing the row of data in the sensing circuitry 211. The row of data can then be re-stored in the memory cells. Refreshing the memory cells can prevent loss of data and/or data corruption due to charge leakage as is performed, for example, in DRAM refresh operations.

The refresh operations can include refreshing one or more rows of memory cells interposed with read or write operations. For example, during a first duration of time, a first row of memory cells can be refreshed. During a second duration of time, a second row of memory cells can be read. During a third duration of time, a third row of memory cells can also be refreshed.

Performing the background operations can include searching for data concurrently with a refreshing of memory cells, a reading of the memory cells, and/or a writing of the memory cells. The memory array 210 can be searched as the data read from the memory array is stored in the sensing circuitry 211 and/or as the data is stored in the memory array 210.

Performing a background operation can include providing row addresses, column addresses, data, and/or a result of the comparison operations to the SRAM 222. The SRAM 222 can receive the row addresses from the row decoder 208. The SRAM 222 can receive column addresses from the column decoder 212. The SRAM 222 can receive the search data from the data interface 204-5. As used herein, the term "search data" describes data that is being searched for. For example, the search data can provide data that is being searched for. The SRAM 222 can receive the result of the search from the sensing circuitry 211.

In some examples, the sensing circuitry 211 can compare the search data with the data read from the memory array 210. The search data and the data read from the memory array 210 can be stored in the sensing circuitry 211.

Responsive to comparing the search data with the data read from the memory array 210, the sensing circuitry 211 can provide a signal to the SRAM to latch the row address, column address, and/or the search data. The sensing circuitry 211 can also provide an indication of the columns associating with a match between the search data and the data read from the memory cells to the column decoder 212. The column decoded 212 can encode or decode the column information provided by the sensing circuitry 211 to generate a column address corresponding to columns associated with a match between the search data and the data read from the memory array 210. If no match is identified, then the sensing circuitry 211 can refrain from providing an indication of the columns to the column controller.

The row decoder 208 can provide an indication of a row address to the SRAM 222. The row decoder 208 can provide the indication of the row address because reading the data from the memory array 210 to latch the data in the sensing circuitry 211 includes accessing the data utilizing a corresponding row address. The row decoder 208 can provide the row address to the SRAM 222 regardless of whether a match is identified by the sensing circuitry 211. Providing the row address, the column address, and/or the search data can to the SRAM 222 does not include storing the row address, the column address, and/or the search data in the SRAM 222. The SRAM 222 may store the data (e.g., the row address, column address, and/or search data) that is provided responsive to receiving a signal from the sensing circuitry 211 indicating that a match was identified. If no match is indicated then the row address, the column address, and/or the search data provided to the SRAM 222 may not be stored by the SRAM 222.

In some examples, the sensing circuitry 211 can identify multiple matches between the search data and the data read from the memory array 210. The sensing circuitry 211 can provide multiple signals to the SRAM 222 indicating that multiple matches are identified. The SRAM 222 can latch/store multiple row addresses and/or column addresses along with the search data to record the matches. For example, the SRAM 222 can store multiple entries wherein each entry comprises the search data, a column address, and/or a row address. The SRAM 222 can also store the search data, a plurality of column addresses, and a plurality of row addresses where the plurality of column addresses and the plurality of row addresses can comprise column/row address pairs which define a match. Although the examples described herein identify a match utilizing row addresses and column addresses, a match can also be identified using row addresses or column addresses.

In some embodiments, the background operations including a search operation can be performed intermittently. For example, background operations that are performed concurrently with refresh operations may be restricted to being performed during refresh operations and may not be performed during read, write, or erase operations. Given that the memory array 210 is not refreshed entirely at any given time, but may be refreshed intermittently with read operations, write operations, and/or erase operations, the background operations may also be performed intermittently with read operations, write operations, and/or erase operations.

Background operations performed concurrently with refresh operations may be exhaustive. That is, the entire memory array 210 may be searched given that the entire memory array 210 is refreshed over time. In some examples, the memory array 210 may be searched by refreshing portions of the memory array 210 that store data. However, background operations that are performed concurrently with read operations, write operations, and/or erase operations may not be exhaustive given that the entire memory array 210 may not be written to, read, or erased in an amount of time. As such, background operations received by the control circuitry may describe a time limitation in which the background operations are performed.

A memory device 203 may process multiple background operations concurrently. For example, the memory device 203 may process a first background operation performed concurrently with read operations and a second background operation performed concurrently with refresh operations. The memory device 203 can receive and/or process multiple commands in the time that a background operation is performed. Given the nature of the background operation and the uncertainty in determining a time in which the results of the background operations are available, the SRAM 222 can be utilized to allow the host to access the results of the background operations without synchronizing a response comprising the results between the memory device 203 and the host.

Figure 3:
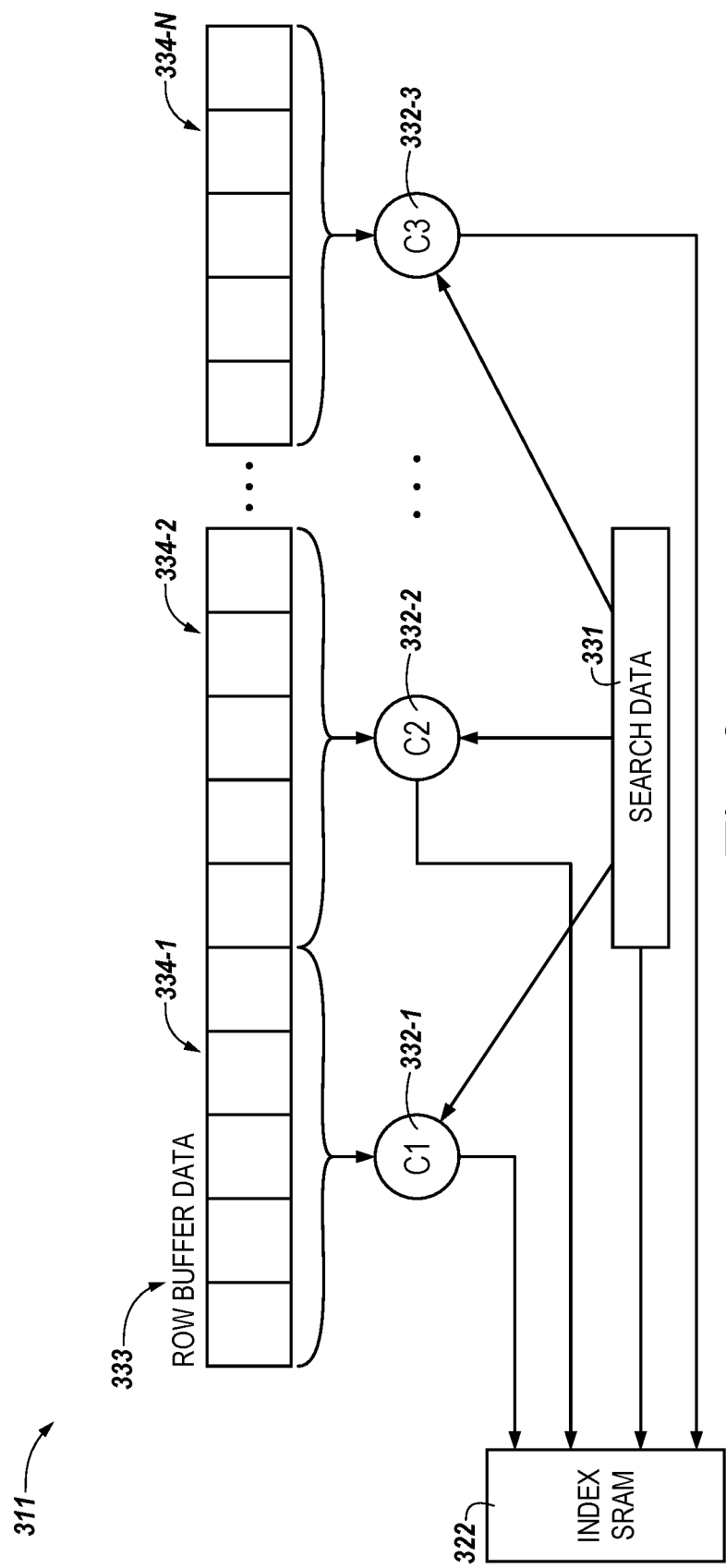
FIG. 3 is a block diagram of sensing circuitry in accordance with a number of embodiments of the present disclosure.

FIG. 3 is a block diagram of sensing circuitry 311 in accordance with a number of embodiments of the present disclosure. The sensing circuitry 311 is shown as being coupled to the SRAM 322. The sensing circuitry 311 includes a row buffer 333 and comparators 332-1, 332-2, . . . , 332-N. The sensing circuitry 311 also includes circuitry configured to store the search data 331.

The row buffer 333 can include circuitry configured to latch/store a row of data read from a memory array. The row of data can include a plurality of bits that can be subdivided to describe a plurality of data values 334-1, 334-2, . . . , and 334-N, referred to as data values 334. Each of the data values 334 can include five bits. In various embodiments, the data values can include more or less than five bits. For example, the data values can include 8, 16, or 32 bits, among other quantities of bits that can comprise a data value.

In a number of examples, the search data 331 can comprise a same quantity of bits as each of the data values. In other examples, the search data 331 can comprise fewer bits than the data values 334 or more bits than the data values 334. Although the sensing circuitry is shown as storing a single instance of the search data 331, in other examples, multiple instances of the search data 331 can be stored in the sensing circuitry 311. For example, the quantity of instances of the search data 331 can be equal to the quantity of data values 334 and/or the comparators 332.

The comparators 332 can comprise circuitry configured to compare the bits of the data values 334 to the bits of the search data 331. If the bits of any one of the data values 334 are equal to, greater than, or less than the bits of the search data 331, then the comparators 332 can indicate a match between a corresponding data value and the search data 331. The sensing circuitry 311 can provide said indication of a match to the SRAM 322.

In some examples, the comparators 332 can also provide their indication of a match to the column decoder (e.g., column decoder 212 in FIG. 2). The column decoder can be configured to translate the indication of a match to a column address. The translation from an indication to a column address can be described as an encoding or decoding. As such, the comparators 332 can be configured to identify a match between the data values 332 and the search data 331 and to identify the columns of the memory array corresponding to the match. For instance, if the comparator 332-1 identifies match, then the indication from the comparator 332-1 can identify that memory cells coupled to the sense lines corresponding to the data value 334-1 store the data value 334-1. The indication of the sense lines can be translated to an address(es) corresponding to said sense lines.

Figure 4:
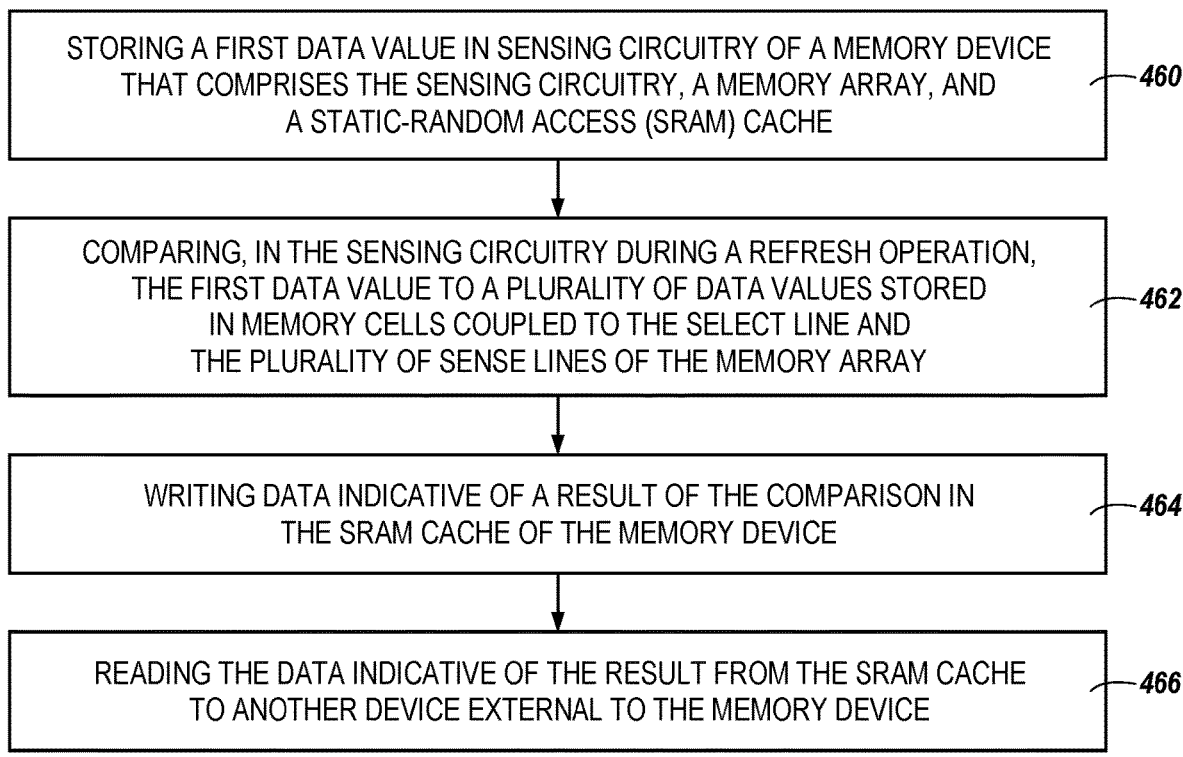
FIG. 4 illustrates an example flow diagram of a method for performing operations in memory in accordance with a number of embodiments of the present disclosure.

FIG. 4 illustrates an example flow diagram of a method for performing operations in memory in accordance with a number of embodiments of the present disclosure. At 460, a first data value can be stored in sensing circuitry of a memory device that comprises the sensing circuitry, a memory array, and an SRAM cache.

At 462, a first data value can be compared to a plurality of data values in the sensing circuitry. The data values can be stored in memory cells coupled to a select line and a plurality of sense lines of a memory array. The comparison can be performed during a refresh operation. The first data value can be stored in the sensing circuitry.

At 464, the result of the comparison can be written in SRAM cache of the memory device. The SRAM cache can be a register that can be accessed by a host. At 466, the data indicative of the result can be read from the SRAM cache to another device external to the memory device. Access can be provided to a host, for example.

The plurality of data values can be latched in the sensing circuitry prior to comparing the first data value to the plurality of data values. The plurality of data values can be utilized to refresh the memory cells. The plurality of data values can be latched prior to refreshing the memory cells.

The plurality of data values can be a row of data from the memory array. For example, the plurality of data values can be stored in memory cells coupled to a same select line. After comparing the first data value to the plurality of data values during a same clock cycle used to perform the refresh operation of the memory cells storing the plurality of data values, the first data value can be compared to a different plurality of data values.

The different plurality of data values can be stored in different memory cells coupled to a different select line and the plurality of sense lines of the memory array such that the different plurality of data values constitutes a different row of data. The comparison can be performed during a different refresh cycle than a refresh cycle utilized to compare the first data value to the plurality of data values.

Data value comparison can be performed during a same clock cycles that is used to refresh the memory cells without interfering with the refreshing of the memory cells. The comparison of the data values and the refreshing of the memory cell can be separate operations that are performed simultaneously. For example, the comparison can be performed during the same clock cycle is used to perform the refresh operation. The data values can be compared concurrently with the refresh of the memory cells because the data values can be compared in less time than is needed to refresh the memory cells. The data values can be compared during a refresh cycle because the data values are stored in the sensing circuitry as part of the refresh cycle and are utilized to perform the comparison.

The result of the comparison can include multiple matches between the first data value and the plurality of data values. For example, the first data value can be matched to two or more data values from a row of data values (e.g., the plurality of data values).

In various instances, the data value stored in memory cells coupled to a select line and a plurality of sense lines of the memory array can be compared to a plurality of data values stored in different memory cells of the memory array coupled to a different select line and the plurality of sense lines. Both the data value and the plurality of data values can be store in the memory array. The comparison can be performed without latching both the data value and the plurality of data values in the sensing circuitry. For example, the comparison can be performed utilizing a single latch in a sense amplifier of the sensing circuitry and not multiple latches in the sense amplifier of the sensing circuitry.

A column address corresponding to the result of the comparison operation can be provided to the SRAM. A signal can also be provided to the SRAM to latch the column address, a row address of the memory array, and the data value responsive to the result of the comparison operation. The column address can be provided by a column decoder and the row address can be provided by a row decoder. The row address and the column address can be represented using bits which can comprise data values or simply data. The bits can also be referred to as bit-vectors.

Comparing the data value to the plurality of data values can include activating the select line and the different select line concurrently. Activating the select lines and the different select lines concurrently can enable memory cells storing the data value and memory cells storing the plurality of data values to be activated concurrently. Activating memory cells coupled to the select line and memory cells couple to the different select line concurrently enables the first charges stored in the memory cells couple to the select line and the second charges stored in memory cells coupled to the different select lines to be combined in the sensing circuitry. Combining charges can include combining a first charge stored in a first memory cell with a second charge stored in a second memory cell.

The sensing circuitry can latch a plurality of voltages provided via the plurality of sense lines responsive to activating the select line and the different select line. The sensing circuitry can identify a match if a latched voltage is VDD or 0. The sensing circuitry can identify no match if the latched voltage is not VDD or 0. For instance, the sensing circuitry can identify no match if the latched voltage is VDD/2. If a voltage representing a 1 or a 0 is expected, then combining two different voltages that both represent a 1 or a 0 does not change the expected voltage which identifies matching bits. If a first voltage representing a 1 and a second voltage representing a 0 are combined the voltage latched at the sensing circuitry will not be expected. An unexpected voltage can identify bits as not matching. Comparing bits and/or data values stored in memory cells may not facilitate performing the comparison as a background operation given that the voltages are combined and moved to the sensing circuitry to perform the comparison. Combining voltages can utilize the sensing circuitry in such a way that refresh operations, read operations, and/or write operations may not be performed concurrently.

Figure 5:
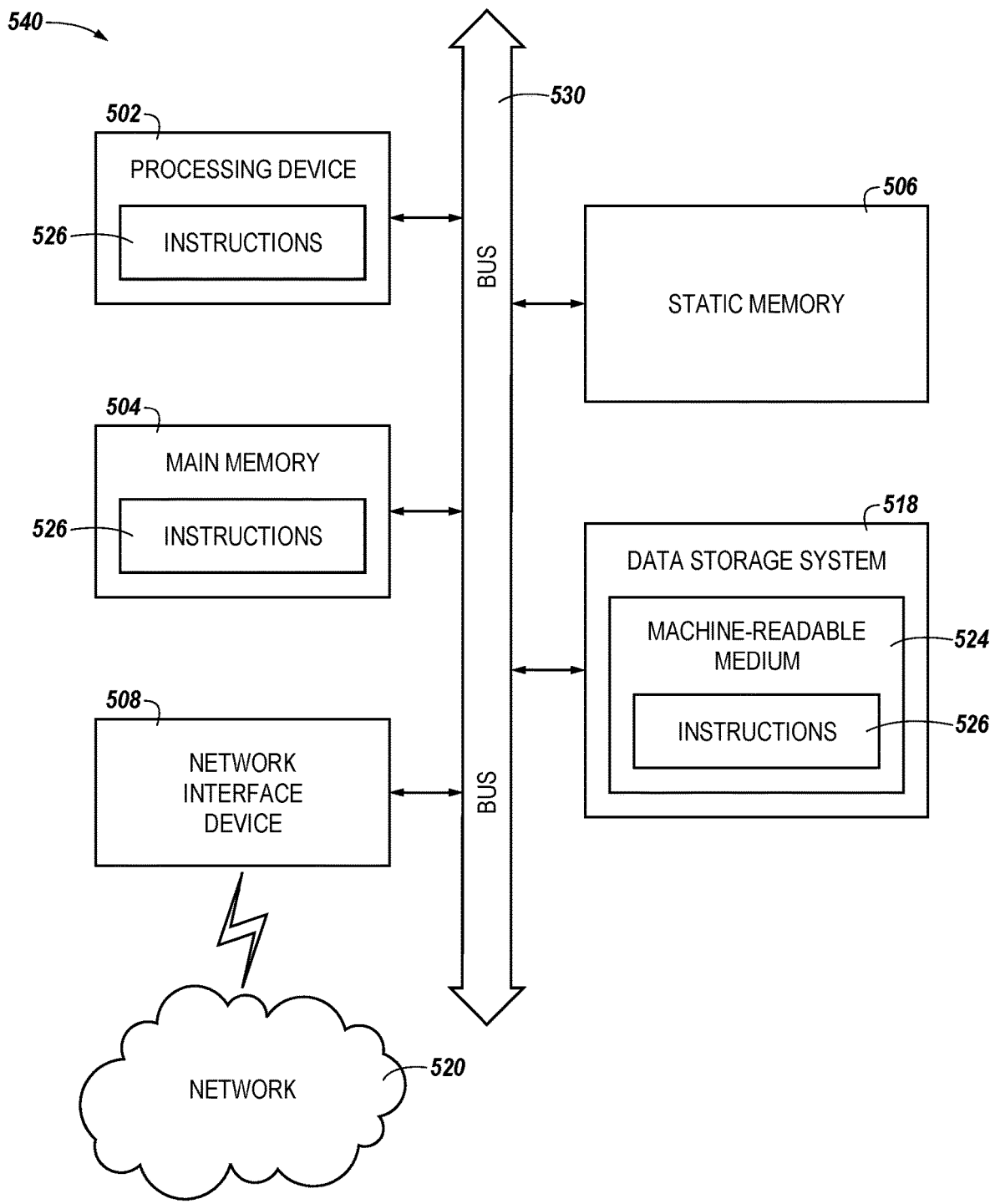
FIG. 5 illustrates an example machine of a computer system within which a set of instructions, for causing the machine to perform various methodologies discussed herein, can be executed.

FIG. 5 illustrates an example machine of a computer system 540 within which a set of instructions, for causing the machine to perform various methodologies discussed herein, can be executed. In various embodiments, the computer system 540 can correspond to a system (e.g., the system 100 of FIG. 1) that includes, is coupled to, or utilizes a memory sub-system (e.g., the memory device 103 of FIG. 1) or can be used to perform the operations of a controller (e.g., the controller 105 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 540 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 540 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 540, the main memory 504 and the processing device 502 also constituting machine-readable storage media.

In one embodiment, the instructions 526 include instructions to implement functionality corresponding to the host 102 and/or the memory device 103 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    causing a first data value to be compared, in sensing circuitry and during a refresh cycle used to refresh memory cells, to a plurality of data values stored in the memory cells coupled to a select line and a plurality of sense lines of a memory array, wherein the first comparison of the first data value to the plurality of data values is performed as a background operation and using a quantity of comparators that is less than the plurality of sense lines, wherein the first data value is received from a host without being stored in the memory array;
    comparing, in the sensing circuitry during a different refresh cycle than the refresh cycle, the first data value to a different plurality of data values stored in different memory cells coupled to a different select line and the plurality of sense lines of the memory array;
    causing a result of the first comparison of the first data value to the plurality of data values to be written to a register; and
    causing the register to be made accessible to the host.

2. The method of claim 1, further comprising causing the first data value to be compared during a performance of a read operation or a write operation wherein the first comparison of the first data value and the performance of the read operation or the write operation are separate operations that are performed simultaneously.

3. The method of claim 1, wherein the first data value is stored in the sensing circuitry.

4. The method of claim 1, wherein multiple instances of the first data value are stored in the sensing circuitry and further comprising causing the multiple instances of the first data value to be compared to the plurality of data values.

5. The method of claim 1, wherein the register is comprised of static random-access memory (SRAM).

6. The method of claim 1, wherein the result comprises a row address of memory cells that store the first data value, a column address of the memory cells that store the first data value, and the first data value.

7. The method of claim 6, further comprising providing, via a row controller, the row address to the register.

8. The method of claim 6, further comprising providing, via a column controller, the column address to the register.

9. The method of claim 1, further comprising writing, via the sensing circuitry, the result to the register.

10. The method of claim 1, further comprising identifying a portion of sense lines from a plurality of sense lines of the memory array that correspond to a second data value, from the plurality of data values, stored in a portion of memory cells from the memory cells, wherein the second data value matches the first data value.

11. The method of claim 10, further comprising causing the column address to be generated based on the identified portion of the sense lines.

12. A method comprising:
    storing a first data value in sensing circuitry of a memory device that comprises the sensing circuitry, a memory array, and a static-random access (SRAM) cache register;
    comparing, in the sensing circuitry during a refresh operation used to refresh memory cells, the first data value to a plurality of data values stored in the memory cells coupled to the select line and the plurality of sense lines of the memory array, wherein the first comparison of the first data value to the plurality of data values is performed as a background operation and using a quantity of comparators that is less than the plurality of sense lines, wherein the first data value is received from a host without being stored in the memory array;
    comparing, in the sensing circuitry during a different refresh cycle than a refresh cycle utilized to compare the first data value to the plurality of data values, the first data value to a different plurality of data values stored in different memory cells coupled to a different select line and the plurality of sense lines of the memory array;
    writing data indicative of a result of a first comparison of the first data value to the plurality of data values in the SRAM cache register of the memory device; and
    reading the data indicative of the result from the SRAM cache register to another device external to the memory device.

13. The method of claim 12, further comprising:
    latching the plurality of data values in the sensing circuitry prior to refreshing the memory cells utilizing the latched plurality of data values.

14. The method of claim 12, wherein the first comparison is performed during a same clock cycle as the refresh operation.

15. The method of claim 12, wherein the result comprises multiple matches between the first data value and the plurality of data values.

16. A method, comprising:
    storing a particular data value and a plurality of data values;
        comparing, during a refreshing of memory cells of a memory array, the particular data value stored in the memory cells coupled to a select line and a plurality of sense lines of the memory array to the plurality of data values stored in different memory cells of the memory array coupled to a different select line and the plurality of sense lines and using a quantity of comparators that is less than the plurality of sense lines, wherein the particular data value is received from a host without being stored in the memory array;

comparing, in sensing circuitry during a different refresh cycle than a refresh cycle utilized to compare the particular data value to the plurality of data values, the first particular data value to a different plurality of data values stored in additional memory cells coupled to an additional select line and the plurality of sense lines of the memory array;

providing a column address, corresponding to a result of a first comparison operation of the particular data value to the plurality of data values, including a match, to static random-access memory (SRAM);

providing a signal to the SRAM to store a first data comprising the column address, a second data comprising a row address of the memory address, and the particular data value responsive to the result of the first comparison operation of the particular data value to the plurality of data values.

17. The method of claim 16, further comprising activating, via the sensing circuitry, the select line and the different select line concurrently to compare the particular data value to the plurality of data values.

18. The method of claim 17, further comprising latching, via the sensing circuitry, a plurality of charges provided via the plurality of sense lines responsive to activating the select line and the different select line.

19. The method of claim 18, further comprising identifying, via the sensing circuitry, the match responsive to comparing the particular data value to the plurality of data values if sensed voltages corresponding to the plurality of charges are VDD or 0 and is further configured to identify no matches if the sensed voltages are VDD/2.

* * * * *